United States Patent
de Swiet et al.

(10) Patent No.: US 6,812,703 B2
(45) Date of Patent: Nov. 2, 2004

(54) RADIO FREQUENCY NMR RESONATOR WITH SPLIT AXIAL SHIELDS

(75) Inventors: Thomas de Swiet, Redwood City, CA (US); Knut G. Mehr, San Francisco, CA (US)

(73) Assignee: Varian, Inc., Palo Alto, CA (US)

( * ) Notice: Subject to any disclaimer, the term of this patent is extended or adjusted under 35 U.S.C. 154(b) by 14 days.

(21) Appl. No.: 10/320,936

(22) Filed: Dec. 17, 2002

(65) Prior Publication Data

US 2004/0113617 A1 Jun. 17, 2004

(51) Int. Cl.[7] .................................................. G01V 3/00
(52) U.S. Cl. ...................................................... 324/318
(58) Field of Search ................................ 324/300, 307, 324/309, 313, 318–322; 600/410, 422; 333/219, 221, 222–225, 227, 230

(56) References Cited

U.S. PATENT DOCUMENTS

| | | | |
|---|---|---|---|
| 4,665,368 A | * 5/1987 | Sugiyama et al. | 324/318 |
| 4,851,780 A | * 7/1989 | Dejon et al. | 324/322 |
| 4,875,013 A | 10/1989 | Murakami et al. | |
| 4,987,370 A | 1/1991 | Leussler et al. | |
| 5,144,239 A | 9/1992 | Oppelt et al. | |
| 5,192,911 A | 3/1993 | Hill et al. | |
| 5,247,256 A | * 9/1993 | Marek | 324/321 |
| 5,382,903 A | * 1/1995 | Young | 324/318 |
| 5,453,692 A | * 9/1995 | Takahashi et al. | 324/318 |
| 5,457,386 A | * 10/1995 | Matsunaga et al. | 324/318 |
| 5,585,721 A | * 12/1996 | Datsikas | 324/318 |
| 5,592,088 A | * 1/1997 | Matsunaga et al. | 324/318 |
| 5,689,187 A | 11/1997 | Marek et al. | |
| 6,008,650 A | 12/1999 | Behbin | |
| 6,198,962 B1 | * 3/2001 | Su | 600/422 |
| 6,498,487 B1 | * 12/2002 | Haner | 324/318 |
| 6,556,012 B2 | * 4/2003 | Yamashita | 324/318 |
| 6,580,274 B2 | * 6/2003 | Sato | 324/318 |
| 6,661,229 B2 | * 12/2003 | Weyers et al. | 324/318 |
| 6,674,285 B2 | * 1/2004 | Haner | 324/318 |

FOREIGN PATENT DOCUMENTS

| | | |
|---|---|---|
| EP | 1120664 | 8/2001 |
| WO | WO 92/17799 A1 | 10/1992 |

OTHER PUBLICATIONS

Patent Abstracts of Japan No. JP 5 154126,vol. 0175, No. 47, Oct. 4, 1993, Toshiba Corp.
Patent Abstracts of Japan No. 2001 276013, vol. 2002, No. 02, Apr. 2, 2002, GE Yokogawa Medical Systems LTD.
Patent Abstracts of Japan No. 60031070, vol. 0091, No. 56, Jun. 29, 1985, Hitachi LTD.
Article by Samaratunga, RC et al., entitled "Resonator Coils for Magnetic Resonance Imaging at 6 MHz", published by Med. Phys. 15(2), Mar./Apr. 1988, pp. 235–240.

* cited by examiner

*Primary Examiner*—Christopher W. Fulton
*Assistant Examiner*—Dixomara Vargas
(74) *Attorney, Agent, or Firm*—Edward H. Berkowitz; Bella Fishman

(57) ABSTRACT

An NMR probe comprises a resonator formed of two separate conducting loops disposed on opposite sides of the sample, where one loop is driven and the other floats in a preferred operating mode. Slotted shields are disposed coaxially within said loops and outside the sample with slots aligned with gaps between the loops.

10 Claims, 6 Drawing Sheets

RADIO FREQUENCY NMR RESONATOR WITH SPLIT AXIAL SHIELDS

FIELD OF THE INVENTION

The invention is in the field of NMR and relates particularly to RF probe structures.

BACKGROUND OF THE INVENTION

The central components of a modern high resolution liquid sample NMR probe include, at least one resonator for coupling RF (resonant) radiation to (at least one) resonating aggregation of nuclear spins of a sample. The sample is typically of elongate extension along an axis coincidental with the direction of the static polarizing magnetic field $B_0$. The resonator imposes on the sample an RF magnetic field ($B_1$) transverse to $B_0$. The achievable homogeneity of $B_0$ is spatially limited and the practicality of coupling RF power to the resonator through finite leads motivate the use of an RF shielding structure interposed between the leads of the resonator and the sample. The RF shield structure ideally limits RF coupling to the resonant spins located within a prescribed axial region of $B_0$ homogeneity. In particular excitation of sample portions outside the desired region of carefully shimmed $B_0$ homogeneity due to irradiation from the leads is a parasitic effect to be minimized by the shields.

The RF coil and shielding is subject to the deleterious effects of eddy currents arising from rapidly switched independent magnetic fields, such as magnetic gradient fields. Eddy currents induced in the coil and shields produce transient magnetic fields in opposition to the switched field inducing the eddy current. Inasmuch as these parasitic fields are particularly close to the sample, the $B_0$ field homogeneity is degraded and the parasitic fields, with undesirable persistence, also degrade the relative timing of steps associated with a given NMR experiment.

In order to control/reduce eddy currents in RF coil and shield structures operating at room temperature, the prior art has incorporated slots into these conductors. See, for example, U.S. Pat. Nos. 6,008,650; 5,192,911; and WO 92/17799 all commonly assigned with the present invention. To similar effect, see U.S. Pat. No. 4,875,013. It should be appreciated that the eddy current problem is many times more deleterious with the RF resonator at cryogenic temperatures than that experienced with the RF resonator at room temperature. For the purpose of this work cryogenic temperature shall be understood to include temperatures substantially below ambient. Recent advances in NMR include very high Q probes operating at rather low temperature. Under such conditions, eddy currents effects are enhanced and their consequent deleterious effects require more rigorous suppression.

SUMMARY OF THE INVENTION

As employed herein, the RF resonator of saddle coil geometry is completely divided between longitudinally adjacent inductive members to provide two electrically separate loops disposed on opposite facing surfaces enclosing the sample space. Each loop, defining a window to the sample encompasses slightly less then $2\pi$ (around the loop) to accommodate the two leads of each loop. The leads from both loops are disposed longitudinally in the same direction away from the central region (windows) of the loops. In the preferred embodiment the coil is excited by application of RF power to one loop with mutual induction coupling to symmetrically excite the opposite loop.

The shields comprise cylindrical conduction each slotted to provide azimuthal shield portions approaching $\pi$ in angular extent. These shield cylinders are coaxial with the RF coil with the inner axial extent preferably aligned with corresponding outer edges of the RF coil windows. The separate gaps between the loops of the RF coil are preferably aligned with the slots of the shields to provide transverse windows where double resonance experiments are contemplated.

The subject matter of the present application is particularly pointed out and distinctly claimed in the concluding portion of this specification. However, both the organization and method of operation, together with further advantages and objects thereof, may best be understood by reference to the following description taken in conjunction with accompanying drawings wherein like reference characters refer to like elements.

BRIEF DESCRIPTION OF THE DRAWINGS

FIG. 2b shows a planar mapping of RF shields for the prior art of FIG. 2a.

FIG. 3b shows the planar mapping of the RF shields for the RF coils of FIG. 3a.

DETAILED DESCRIPTION OF THE INVENTION

Figure 1:
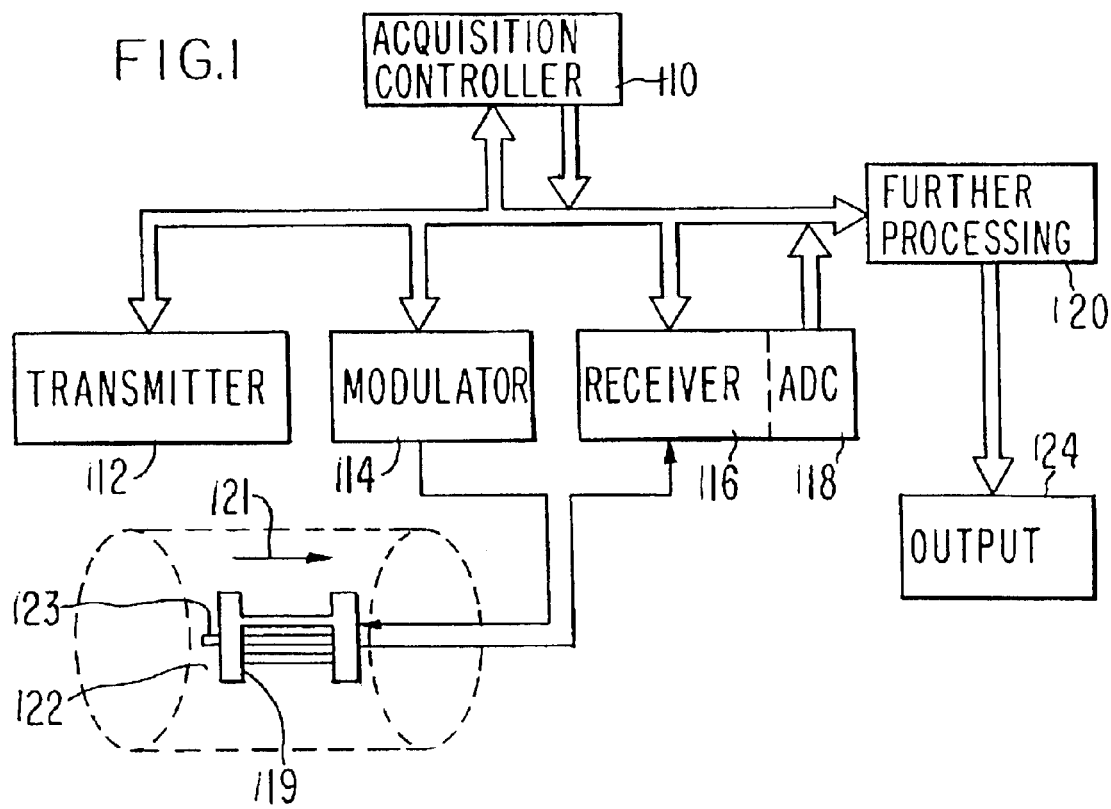
FIG. 1 shows an NMR system incorporating the invention.

FIG. 1 represents the context of the invention represented by schematicised NMR instrument. An acquisition/control processor 110 communicates with an RF source 112, modulator 114 and RF receiver 116, including analog-to-digital convertor 118 and a further digital processor 120. The modulated RF power irradiates an object/sample 123 in a magnetic field 121 through a probe 122 and response of the sample/object is intercepted by probe 122 communicating with receiver 116. The response typically takes the form of a transient time domain waveform or free induction decay. This transient waveform is sampled at regular intervals and the samples are digitized in adc 118. The digitized time domain waveform is then subject to further processing in processor 120. The nature of such processing may include averaging the time domain waveform over a number similar such waveforms and transformation of the averaged time domain waveform to the frequency domain yields a spectral distribution function directed to output device 124. Alternatively, this procedure may be repeated with variation of some other parameter, and the transformation(s) from the data set may take on any of a number of identities for display or further analysis.

Figure 2A:
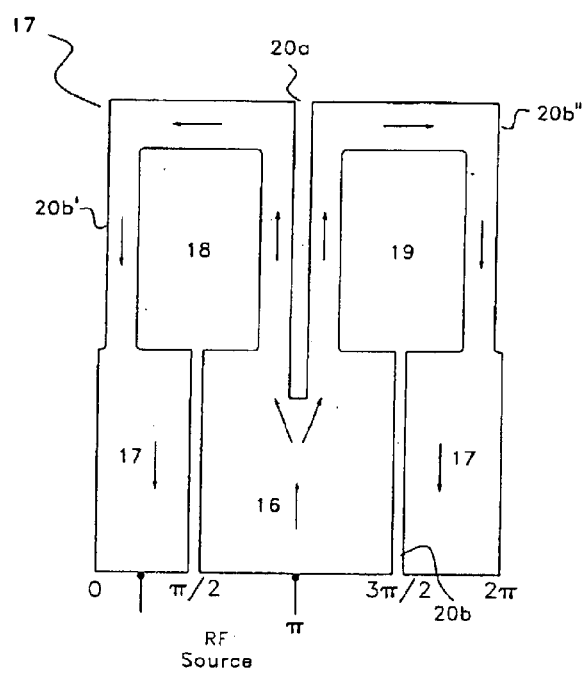
FIG. 2a shows a planar mapping of an RF coil of prior art.
Figure 2B:
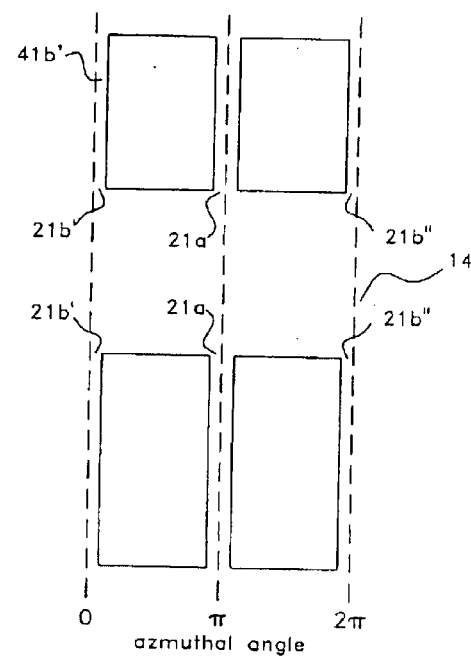

FIG. 2a is representative of (room temperature) prior art slotted resonator structures 12 and FIG. 2b similarly depicts the shielding structure 14 interposed between a sample and the resonator. These figures are planar mappings of the cylindrical forms in use wherein the resonator and shield are understood to exhibit radii a and b respectively where a>b. Arrows within FIG. 2a indicate the instantaneous RF current direction in an embodiment where RF power is applied between terminal portions 16 and 17. Windows 18 and 19 define the two current loops of the coil. Arrows on the several conductor portions suggest the instantaneous current direction. RF magnetic flux ($B_1$) is ideally distributed uniformly through the area of these oppositely facing windows. Slots 20a and 20b (comprising half slots 20b" and 20b') serve to define electrical structure of the resonator structure 12. Prior art has employed RF shields taking the form of cylindrical shell conductors, axially flush with the inner edge of the RF window and extending axially outward to shield portions of the sample (distal in relation to the windows) from unwanted excitation. These shields support eddy currents due to rapidly switched gradient fields. The shield structure 14 may be briefly described as a pair of slotted rings symmetrically aligned with windows 18 and 19 and with slots 21a and 21b (comprising 21b' and 21b") similarly aligned with resonator slots 20a and 20b. The shield structure is typically electrically floating and serves to shield the leads 16 and 17 from the sample and to shield the sample portion remote from the window regions from excitation. This limits sample excitation to the axial region projected from the windows 38 and 39, a region of homogeneity of both the polarizing field and the RF field. As thus described, the prior art may be more closely identified with U.S. Pat. No. 6,008,650 as representative prior art.

Figure 3A:
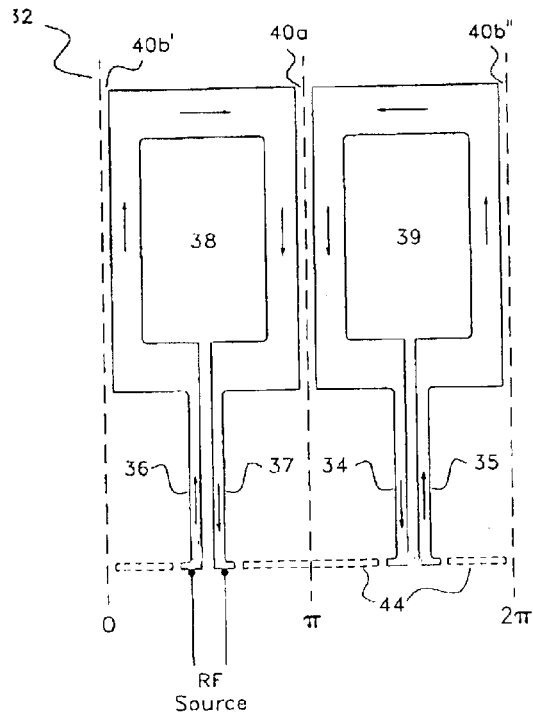
FIG. 3a shows a planar mapping of the RF coil of the invention.
Figure 3B:
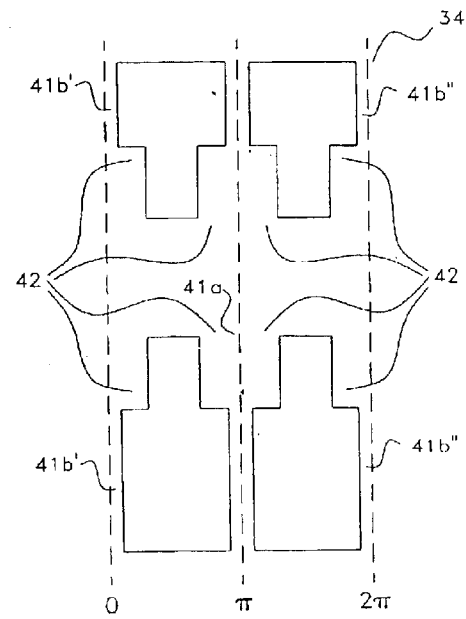
Figure 3C:
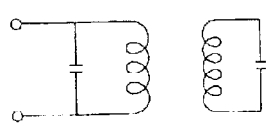
FIG. 3c illustrates the equivalent circuit for the preferred mode of operation.

Turning now to FIGS. 3a and 3b there is shown the preferred embodiment of the invention wherein the resonator 32 comprises two completely distinct current loops surrounding windows 38 and 39. One said loop is excited from leads 36 and 37 and the other loop is excited wholly through mutual inductive coupling to the first loop. Balance and electrical symmetry of the two loops is preserved through maintenance of geometrical symmetry: that is, the phantom (floating) leads 34 and 35 of the inductively coupled loop present similar capacity contribution to loop surrounding window 39 as do the leads 36 and 37 to the driven loop surrounding window 38. In addition to the electrical symmetry thus served, the geometrical symmetry aids in avoiding magnetic inhomogeneties in the polarizing field.

The shield structure 34 presents slot 41a and slot 41b (comprising half slots 41b' and 41b"). Further, the capacitance furnished to each loop is adjusted by indented regions 42. It should be recognized that the slots 41a and 41b in the shield 34, together with corresponding slots 40a and 40b in the resonator form another pair of windows open to the sample. (To preserve nomenclature, the word "slot" is here synonymous with "gap".) These slot windows are oriented orthogonal to the prevailing azimuthal orientation of the windows 38 and 39. These slot windows are convenient for double resonance experiments involving a second coaxial resonator disposed externally to resonator 32. The second resonator illuminates the sample through the aperture formed by the gaps between the loops of resonator 32, wherein two independent resonance conditions are concurrently available with orthogonal directions for the corresponding RF magnetic fields.

Figures 4, 6:
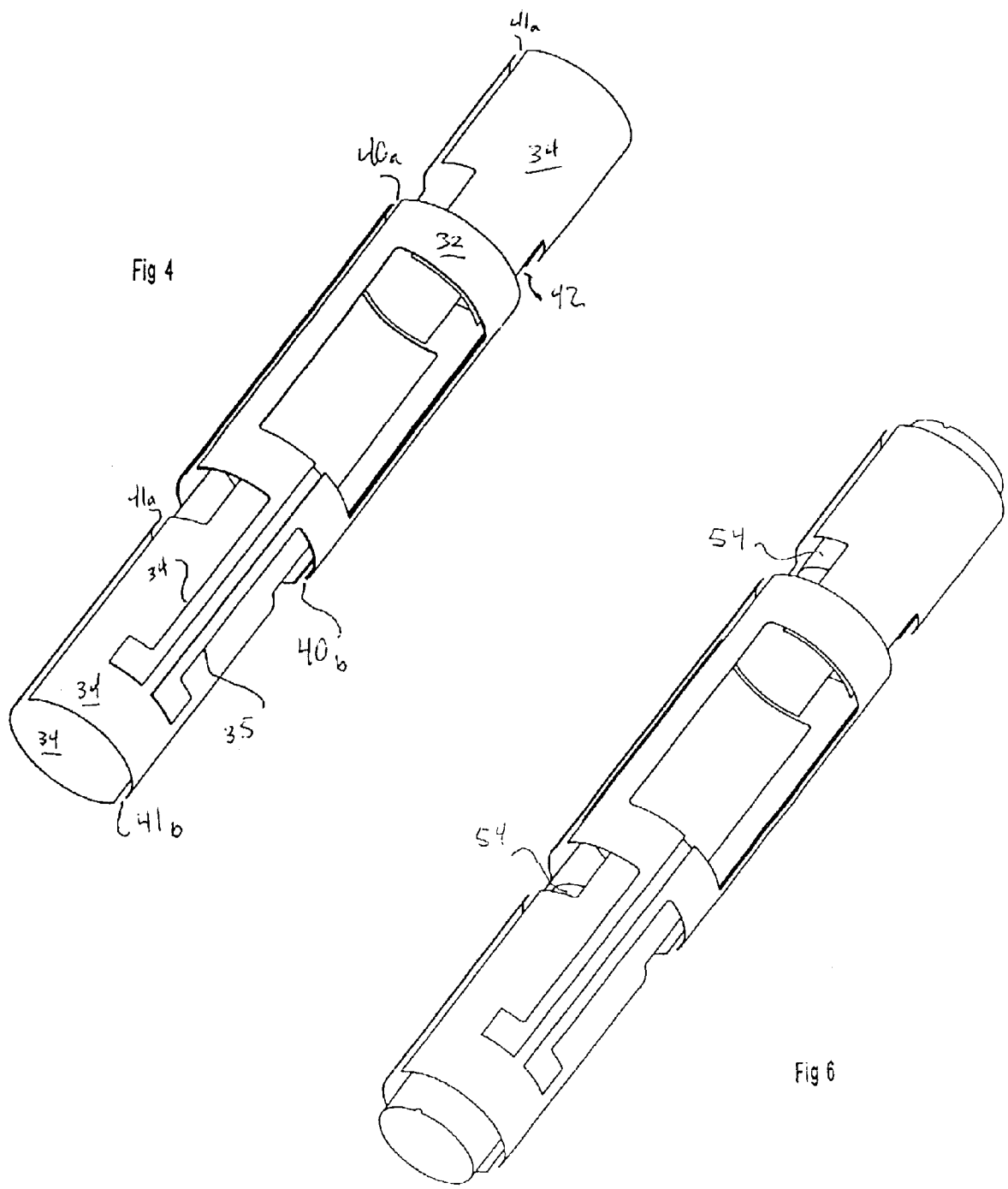
FIG. 4 is a perspective view of the embodiment of FIGS. 3a and 3b.
FIG. 6 illustrates another embodiment of the invention.

FIG. 4 is a perspective view of the resonator and shields of FIGS. 3a and 3b. Corresponding portions of the perspective figure bear the same labels as the planar mappings of FIGS. 3a and 3b.

Figure 3D:
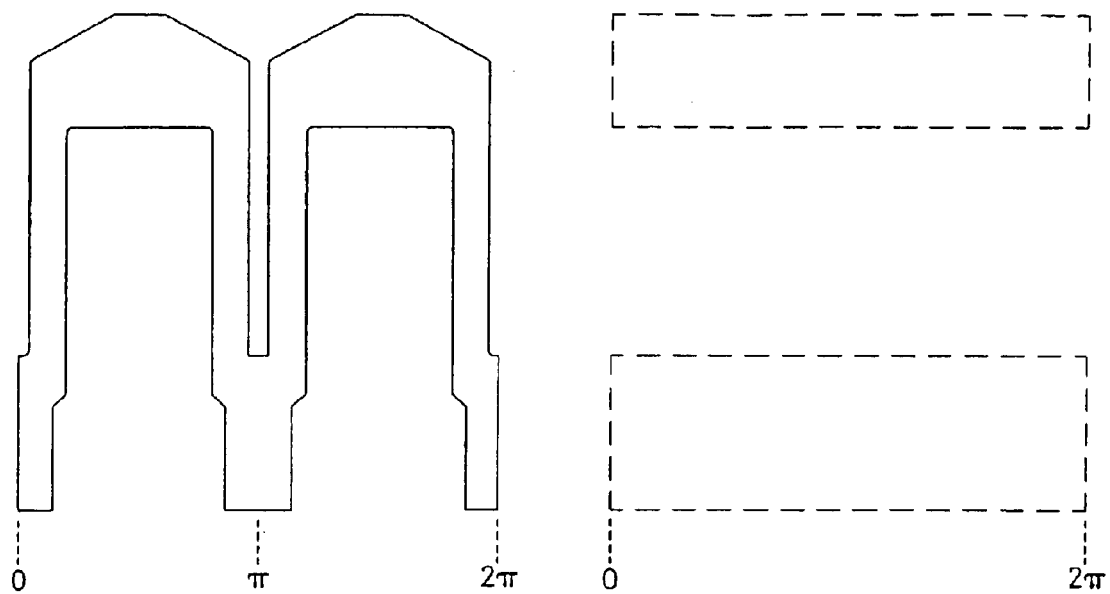
FIG. 3d shows a prior art cryogenic RF coil and shields for a comparative test purpose.
Figure 5:
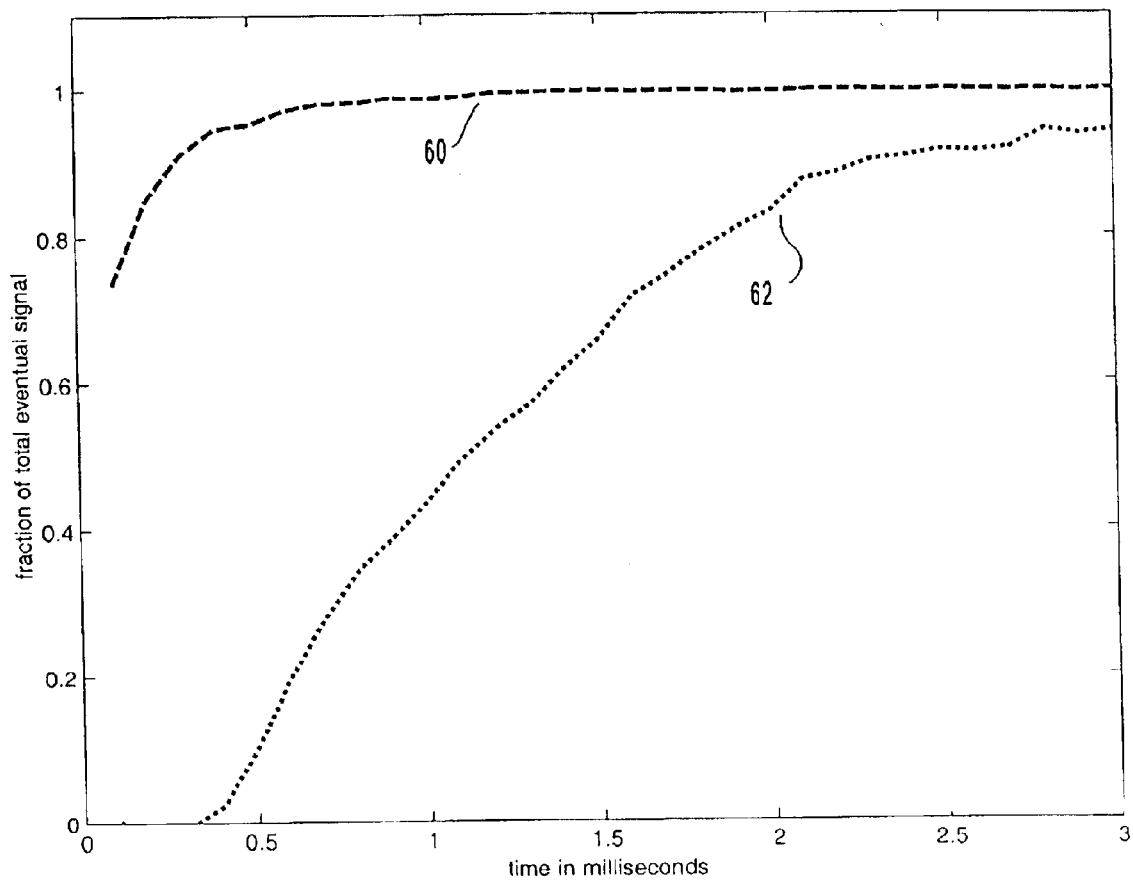
FIG. 5 shows eddy current responsiveness performance of the invention.

One quantitative measure of the efficacy of the invention is the recovery time after a sharp magnetic impulse such as provided by a rapidly switched magnetic gradient field. FIG. 5 compares the response of the present invention with a prior art resonator intended for a cryogenic environment. This prior art is similar to FIG. 2a adapted for cryogenic operation, for example in a Varian "Chili™ type NMR probe as further shown in FIG. 3d for performance comparison with FIG. 3a. The two resonator structures (present invention and prior art), constructed from identical materials are characterized by similar dimensions. It is apparent that the FIG. 3d device is a two terminal slotted resonator with unslotted shields. In contrast the inventive device features full separated current loops, slotted shields and only a single loop is driven (mode a of Table 1 below). For this test, the two resonators were each subject to a magnetic field pulse about 1 ms in width supplied by a surrounding gradient coil of about 30 (gauss/cm). The measured time for recovery to 90% of full NMR amplitude for the resonator of this invention (curve 60) was (about) 250 μsec compared to about 2.5 ms for the prior art (curve 62). It is apparent that the example represents an improved recovery time of about a factor of 10 compared to the representative prior art.

Table 1 is a tabular summary illustrating the several modalities supported by the slotted/gap resonator structure of FIG. 2b through connection of the terminals 34,35 of loop 39, and terminals 36 and 37 of loop 38.

TABLE 1

| Loop configuration | | jumpers | driven terminals |
|---|---|---|---|
| a1) Loop 38 driven, loop 39 floats or, | RF dipole field | N/A | 36 + 37 |
| a2) loop 39 driven, loop 38 floats | | N/A | 34 + 35 |
| b) loops in series/same helicity | RF dipole field | 34→36 | 37 + 35 |
| c) loops in series/opposite helicity | RF gradient field | 34→37 | 35 + 36 |
| d) loops in parallel/same helicity | RF dipole field | 34→37, 35→36 | jumpers |
| e) loops in parallel/opposite helicity | RF gradient field | 36→34, 37→35 | jumpers |

In modes a), terminals 36 and 37 are driven while terminals 34 and 35 float (or vice versa). An homogeneous RF dipole field is excited with axis principally through the (large) windows 38 and 39. In the mode b, terminal 36 (or 37) is excited together with terminal 34 (or 35) to produce an RF resonance at a lower frequency than the a) modes corresponding to the larger inductance of the series combination of the conductors.

Another operational possibility (d in table 1) is established by exciting both loops in phase by driving the two loops in parallel such that adjacent inductive axial members of the opposite facing loops support instantaneous RF currents in the same sense while circulating on the respective loops to produce the principal resonance. [Capacitive coupling between loops across the gaps 40a and 40b (at the opposite end from the terminals) supports a circulating RF current component around gaps 40*a* 40*b* to produce another resonance usually positioned at much higher frequency than the main resonance.] This choice is illustrated in FIG. 3*a* by the dotted lines representing jumpers 44. This operation (and any jumpering between terminals) restores (to some extent) a path for eddy currents that was removed by the major slots 40*a* and 40*b* separating the resonator into two distinct loops. It has been found that this operational approach conveniently facilitates maintenance of a deuterium lock where attenuated eddy current effects are tolerable.

In another operational mode, the corresponding terminals of the respective loops may be connected serially in opposite helicity, e.g., adjacent axial inductive members of the loops support opposite sense of instantaneous RF currents. Similarly, parallel combination of the loops 38 and 39 in opposite helicity may be selected. These operational modes produce a radial RF magnetic field gradient, of interest in certain specialized experiments.

It should be apparent that the several operational modes represented in table 1 would not support resonant operation at the same frequency. For example direct coupling of the coil loops in series will not exhibit the same lumped inductance as where the same loops are connected in parallel. The connection of the opposite facing loops in the same helicity will not present the same mutual inductive coupling as where the same loops are connected in opposite helicity.

Turning to FIG. 6, there is shown another embodiment of the invention particularly suited to cryogenic NMR probe structure wherein the RF coil 32 and shields 34 are disposed in a vacuum space at cryogenic temperature. The inner surface of the vacuum enclosure is the outer (radial) surface of a tubular structure 52, which supports a pair of RF inner shields 54. These inner shields 54 preferably comprise about one mil Cu, e.g., large compared to the skin depth at operational resonance frequencies. These shield members 54, centered on window 38 and 39 are axially separated by a distance in the range of 100% to 200% of the axial window dimensions. The length of shields 54 is not critical. These inner shields serve to further reduce excitation of unwanted resonances from the sample region axially displaced from the window region. For the cryogenic case, these unslotted shield members 54 are at an intermediate temperature, typically, close to ambient because a relatively poor conductivity for these shields is desirable to better reduce the attendant eddy currents. Alternately, these innermost shields might be implemented from a relatively poorly conductor, e.g., an alloy, or these shields might be extremely thin.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. An NMR probe comprising a resonator structure comprising
   first and second conductors forming current supporting loops, each said loop comprising a pair of terminals, said loops disposed on opposing facing portions of the lateral surface of a cylindrical volume, each said loop defining an aperture on respective portions of said lateral surface, said first and second loops separated by first and second gaps on said lateral surface, and
   an RF power source that excites the first loop through one said pair of terminals while exciting the second loon through mutual inductive coupling of first and second loops.

2. The NMR probe of claim 1 further comprising a pair of axially displaced cylindrical shells, each said shell disposed coaxially within said resonator, each said shell comprising an axial slot therein, oppositely facing edges of said shells in substantial axial alignment with axial inner edges of said loops.

3. The NMR probe of claim 2 wherein said slots are in substantial azimuthal alignment with said gaps.

4. The NMR probe of claim 3 further comprising a pair of conducting cylinders, said conducting cylinders symmetrically disposed on said axis and within and spaced from said cylindrical shells, said conducting cylinders adapted to receive a sample on the axis thereof.

5. The NMR probe of claim 3 further comprising a dewar for containing said resonator and comprising an inner wall for receiving said sample at ambient temperature and maintaining said resonator and said shells at a cryogenic temperature.

6. The NMR probe of claim 5 wherein the inner surface of the inner wall of said dewar supports a pair of conducting cylinders in substantial axial alignment with said shells.

7. The NMR probe of claim 6 or 4 wherein said conducting cylinders exhibit relatively poor conductivity such that eddy currents induced on the surfaces thereof are rapidly attenuated.

8. The method of operating an NMR probe comprising a resonator structure comprising first and second loops disposed on opposite sides of said sample, each said loop comprising a pair of terminals precluding closure of said loop, said method comprising the steps of
   driving the first said loop through said terminals by applying RF power thereto,
   floating the terminals of said second loop and inductively coupling said second loop to said first loop.

9. An NMR system for study of a sample, comprising a magnet for supplying a homogeneous magnetic field, an RF source and an RE detector and an NMR probe disposed within said magnetic field and communicating selectively with said RF source and said RE detector, said probe comprising a resonator structure comprising
   first and second conductors forming current supporting loops, each said loop comprising a pair of terminals, said loops disposed on opposing facing portions of the lateral surface of a cylindrical volume, each said loop defining an aperture on respective portions of said lateral surface, said first and second loops separated by first and second gaps on said lateral surface, wherein one said loop is driven and the other said loop is electrically floating.

10. The apparatus of claim 9 wherein the resulting four said terminals are accessible for communication with an RF source in a variety of ways to implement corresponding distinct circuit properties.

* * * * *